(12) United States Patent
Hao

(10) Patent No.: US 9,721,513 B2
(45) Date of Patent: Aug. 1, 2017

(54) NAND GATE LATCHED DRIVING CIRCUIT AND NAND GATE LATCHED SHIFT REGISTER

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 214 days.

(21) Appl. No.: 14/433,661

(22) PCT Filed: Jan. 28, 2015

(86) PCT No.: PCT/CN2015/071710
§ 371 (c)(1),
(2) Date: Apr. 4, 2015

(87) PCT Pub. No.: WO2016/106925
PCT Pub. Date: Jul. 7, 2016

(65) Prior Publication Data
US 2016/0343310 A1    Nov. 24, 2016

(30) Foreign Application Priority Data
Dec. 30, 2014  (CN) .......................... 2014 1 0850862

(51) Int. Cl.
*G09G 3/36* (2006.01)
*G11C 19/28* (2006.01)

(52) U.S. Cl.
CPC .............. *G09G 3/36* (2013.01); *G11C 19/28* (2013.01); *G09G 2310/0286* (2013.01); *G09G 2310/0291* (2013.01); *G09G 2310/08* (2013.01); *G09G 2330/021* (2013.01)

(58) Field of Classification Search
CPC ............. G09G 3/36; G09G 2310/0286; G09G 2310/0291; G09G 2310/08; G09G 2330/021; G11C 19/28
See application file for complete search history.

(56) References Cited

U.S. PATENT DOCUMENTS

| 2013/0176056 A1* | 7/2013 | Kim .......................... H03K 5/13 327/2 |
| 2015/0248867 A1* | 9/2015 | Tan .......................... G11C 19/28 345/100 |
| 2016/0351112 A1* | 12/2016 | Qing .................... G09G 3/2096 |

* cited by examiner

*Primary Examiner* — Nelson Rosario
(74) *Attorney, Agent, or Firm* — Andrew C. Cheng

(57) ABSTRACT

The invention provides a NAND gate latched driving circuit and a NAND gate latched shift register. The NAND gate latched driving circuit includes multiple cascade connected shift register circuits, each of the shift register circuits including a clock control transmission circuit and a NAND gate latch circuit. The clock control transmission circuit is triggered by a first clock pulse of a clock signal to transmit a driving pulse of a former stage to the NAND gate latch circuit, the driving pulse then is latched by the NAND gate latch circuit. The NAND gate latch circuit further is triggered by a subsequent second clock pulse of a first clock signal to output the latched driving pulse. By the above solution, the NAND gate latched driving circuit of the invention is suitable for CMOS process and can achieve low power consumption and wide noise tolerance.

14 Claims, 3 Drawing Sheets

NAND GATE LATCHED DRIVING CIRCUIT AND NAND GATE LATCHED SHIFT REGISTER

TECHNICAL FIELD

The invention relates to the field of liquid crystal display technology, and particularly to a NAND gate latched driving circuit and a NAND gate latched shift register.

DESCRIPTION OF RELATED ART

A GOA (gate driver on array) circuit technology uses an array process of conventional liquid crystal display device to manufacture a gate scan driving circuit on an array substrate and thereby to achieve a progressive scan driving mode. The GOA circuit has advantages of reduced production cost and narrow-border design and thus is used for a variety of display devices. The GOA circuit needs to have two basic functions: a first one is to input gate driving signals to drive gate lines in a panel and thereby switch on TFTs (thin film transistors) in a display area to allow the scan lines to control the charge of pixels; and a second one is shift register function, so that when the output of an nth gate driving pulse is completed, it subsequently carries out the output of the (n+1)th gate driving pulse by clock control; and the like.

The GOA circuit includes a pull-up circuit, a pull-up control circuit, a pull-down circuit, a pull-down control circuit and a boost circuit responsible for potential lift-up. In particular, the pull-up circuit mainly is responsible for outputting an inputted clock signal to a gate of a thin film transistor as a driving signal of a liquid crystal display device. The pull-up control circuit is responsible for controlling the pull-up circuit to be switched on and generally is subjected to the control of a signal delivered from a preceding-stage GOA circuit. The pull-down circuit is responsible for quickly pulling down a scan signal to a low voltage level after outputting the scan signal, i.e., pulling down the potential of the gate of the thin film transistor to the low voltage level. The pull-down control circuit is responsible for maintaining the scan signal and a signal of the pull-up circuit (generally referred to as Q node signal) at a switched-off state (i.e., a preset negative potential) and generally has two pull-down maintaining circuits which alternately work. The boost circuit is responsible for lifting up the potential at the Q node once again so as to ensure the normal output of G(N) of the pull-up circuit.

Different GOA circuits may use different manufacturing processes. The LTPS (low temperature poly-silicon) process has advantages of high electron mobility and mature technology and thus currently has been widely used by small and medium-sized display devices. The CMOS (complementary metal oxide semiconductor) LTPS process has advantages of low power consumption, high electron mobility and wide noise tolerance, etc., and thus has been gradually used by panel makers. Accordingly, there is a need of developing a GOA circuit corresponding to the CMOS LTPS process.

SUMMARY

Accordingly, embodiments of the invention provide a NAND gate latched driving circuit and a NAND gate latched shift register, which are suitable for CMOS process and can achieve low power consumption and wide noise tolerance.

In particular, the invention provides a NAND gate latched driving circuit including a plurality of cascade connected NAND gate latched shift register circuits. Each of the shift register circuits includes a clock control transmission circuit and a NAND gate latch circuit. The clock control transmission circuit is configured (i.e., structured and arranged) for being triggered by a first clock pulse of a clock signal to transmit a driving pulse of a former stage to the NAND gate latch circuit, and the driving pulse then is latched by the NAND gate latch circuit, the NAND gate latch circuit further is configured for being triggered by a subsequent second clock pulse of a first clock signal to output the driving pulse. The clock control transmission circuit and the NAND gate latch circuit individually are rising edge triggered. The NAND gate latch circuit at least includes a first inverter, a first NAND gate, a second NAND gate and a third NAND gate; an input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate, and a second input terminal of the third NAND gate is electrically connected to receive the clock signal.

In an embodiment, the clock control transmission circuit phase-inverts the driving pulse in the transmission process of the driving pulse.

In an embodiment, the NAND gate latch circuit further includes a multistage inverter circuit electrically connected to an output terminal of the third NAND gate.

In an embodiment, the multistage inverter circuit includes serially connected a plurality of second inverters.

In an embodiment, the number of the plurality of second inverters is three.

In an embodiment, the clock signals of neighboring ones of the shift register circuits are phase inverted to each other.

The invention further provides a NAND gate latched driving circuit including a plurality of cascade connected NAND gate latched shift register circuits. Each of the shift register circuits includes a clock control transmission circuit and a NAND gate latch circuit. The clock control transmission circuit is configured for being triggered by a first clock pulse of a clock signal to transmit a driving pulse of a former stage to the NAND gate latch circuit, and the driving pulse then is latched by the NAND gate latch circuit, the NAND gate latch circuit further is configured for being triggered by a subsequent second clock pulse of a first clock signal to output the driving pulse.

In an embodiment, the clock control transmission circuit and the NAND gate latch circuit individually are rising edge triggered.

In an embodiment, the NAND gate latch circuit at least includes a first inverter, a first NAND gate, a second NAND gate and a third NAND gate; an input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate, and a second input terminal of the third NAND gate is electrically connected to receive the clock signal.

In an embodiment, the clock control transmission circuit is configured for phase-inverting the driving pulse in the transmission process of the driving pulse.

In an embodiment, the NAND gate latch circuit further includes a multistage inverter circuit electrically connected to an output terminal of the third NAND gate.

In an embodiment, the multistage inverter circuit includes serially connected a plurality of second inverters.

In an embodiment, the number of the plurality of second inverters is three.

In an embodiment, the clock signals of neighboring ones of the shift register circuits are phase inverted to each other.

The invention also provides a NAND gate latched shift register including a clock control transmission circuit and a NAND gate latch circuit. The NAND gate latch circuit at least includes a first inverter, a first NAND gate, a second NAND gate and a third NAND gate. An input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate.

In an embodiment, the NAND gate latch circuit further includes a multistage inverter circuit electrically connected to an output terminal of the third NAND gate.

By the above solutions, the efficacy can be achieved by the invention is that: the NAND gate latched driving circuit of the invention uses a clock control transmission circuit triggered by a first clock pulse of a clock signal to transmit a driving pulse of a former stage to a NAND gate latch circuit, and the driving pulse then is latched by the NAND gate latch circuit; the NAND gate latch circuit further is triggered by a subsequent second clock pulse of a first clock signal to output the driving pulse. Accordingly, the invention is suitable for CMOS process and can achieve low power consumption and wide noise tolerance.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
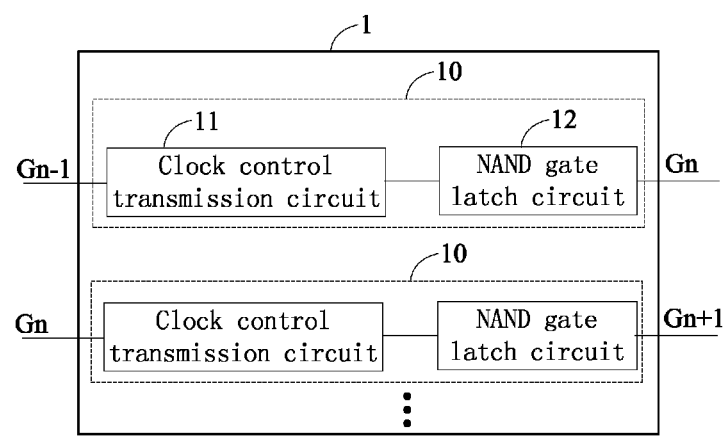
FIG. 1 is a structural schematic view of a NAND gate latched driving circuit of an embodiment of the invention.

Referring to FIG. 1, which is a structural schematic view of a NAND gate latched driving circuit of an embodiment of the invention. As shown in FIG. 1, the driving circuit 1 provided in this embodiment includes a plurality of cascade connected NAND gate latched shift register circuits 10. Each of the shift register circuits 10 includes a clock control transmission circuit 11 and a NAND gate latch circuit 12, the clock control transmission circuit 11 is triggered by a first clock pulse of a clock signal to transmit a driving pulse of a former stage to the NAND gate latch circuit 12, the driving pulse then is latched by the NAND gate latch circuit 12, and the NAND gate latch circuit 12 further is triggered by a subsequent second clock pulse of the clock signal to output a driving pulse. The clock control transmission circuit 11 is for phase-inverting the driving pulse in the course of transmitting the driving pulse. The clock control transmission circuit 11 and the NAND gate latch circuit 12 individually are rising-edge triggered. This embodiment of the invention uses the clock control transmission circuit 11 to control transmission of a signal between former and latter stages and uses the NAND gate latch circuit 12 to latch the signal, and thus is suitable for CMOS process and can achieve low power consumption and wide noise tolerance.

Figure 2:
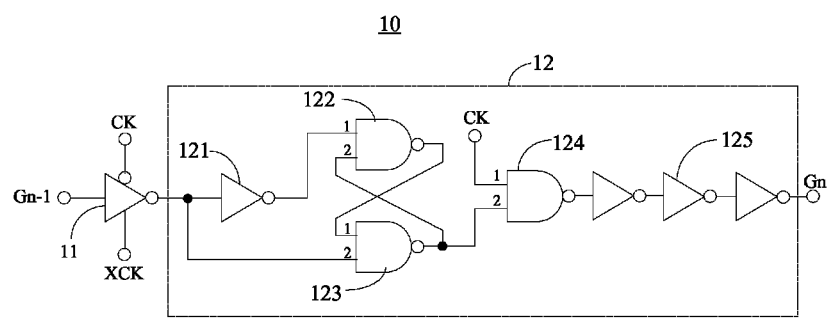
FIG. 2 is a circuit diagram of a shift register as shown in FIG. 1.

In a more particular embodiment, as shown in FIG. 2, the NAND gate latch circuit 12 at least includes a first inverter 121, a first NAND gate 122, a second NAND gate 123 and a third NAND gate 124. An input terminal of the first inverter 121 is electrically connected to an output terminal of the clock control transmission circuit 11, a first input terminal of the first NAND gate 122 is electrically connected to an output terminal of the first inverter 123, a second input terminal of the first NAND gate 122 is electrically connected to an output terminal of the second NAND gate 123, a first input terminal of the second NAND gate 123 is electrically connected to the input terminal of the first inverter 122, a second input terminal of the second NAND gate 123 is electrically connected to an output terminal of the first NAND gate 122, the output terminal of the second NAND gate 123 further is electrically connected to a first input terminal of the third NAND gate 124, a second input terminal of the third NAND gate 124 is electrically connected to receive a clock signal CK. The NAND gate latch circuit 12 further includes a multistage inverter circuit electrically connected to an output terminal of the NAND gate 124 so as to enhance driving capability of the driving circuit 1. The multistage inverter circuit includes a plurality of serially connected second inverters 125. Preferably, the number of the second inverters 125 is three.

A concrete operation principle of the shift register circuit 10 is as follows: when a first clock pulse of the clock signal CK is at a rising edge, the clock control transmission circuit 11 is triggered to transmit a driving pulse Gn−1 of a former stage to the first inverter 121. In the transmission process, the driving pulse Gn−1 is phase-inverted. After that, the driving pulse Gn−1 of the former stage is transmitted to the first NAND gate 122 and the second NAND gate 123 through the first inverter 121 and is latched by the cross-connected first NAND gate 122 and second NAND gate 123. When a second clock pulse of the clock signal CK is at a rising edge, i.e., the next clock pulse of the clock signal CK is at a rising edge, the NAND gate latch circuit 12 is triggered, the driving pulse Gn−1 of the former stage latched by the cross-connected first NAND gate 122 and second NAND gate 123 is transmitted to the second inverters 124 and then is transmitted to a gate Gn of a latter stage. The clock control transmission circuit 11 further includes a clock signal XCK, the clock signal XCK and the clock signal CK being phase inverted.

Figure 3:
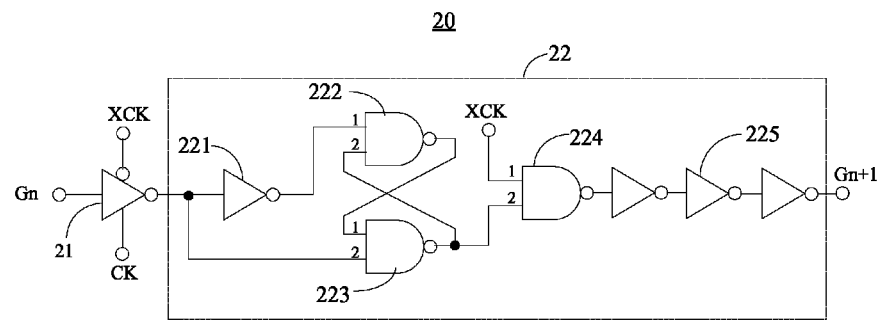
FIG. 3 is a circuit diagram of a shift register of a second embodiment of the invention.

In this embodiment of the invention, clock signals of neighboring shift register circuits are mutually phase inverted. Referring to FIG. 3, the shift register circuit 20 includes a clock control transmission circuit 21 and a NAND gate latch circuit 22. The NAND gate latch circuit 22 at least includes a first inverter 221, a first NAND gate 222, a second NAND gate 223 and a third NAND gate 224. An input terminal of the first inverter 221 is electrically connected to an output terminal of the clock control transmission circuit 21, a first input terminal of the first NAND gate 222 is electrically connected to an output terminal of the first inverter 221, a second input terminal of the first NAND gate 222 is electrically connected to an output terminal of the second NAND gate 223, a first input terminal of the second NAND gate 223 is electrically connected to the input terminal of the first inverter 221, a second input terminal of the second NAND gate 223 is electrically connected to an output terminal of the first NAND gate 222, the output terminal of the second NAND gate 223 further is electrically connected to a first input terminal of the third NAND gate 224, a second input terminal of the third NAND gate 224 is electrically connected to receive a clock signal XCK. The NAND gate latch circuit 22 further includes a multistage inverter circuit electrically connected to an output terminal of the third NAND gate 224 so as to enhance driving capability of the driving circuit 1. The multistage inverter circuit includes serially connected a plurality of second inverters 225. Preferably, the number of the second inverters 225 is three.

A concrete operation principle of the shift register circuit 20 is as follows: when a first clock pulse of the clock signal XCK is at a rising edge, the clock control transmission circuit 21 is triggered to transmit the driving pulse Gn of the latter stage to the first inverter 221. In the transmission process, the driving pulse Gn of the latter stage is phase-inverted. After that, the driving pulse Gn of the latter stage is transmitted to the first NAND gate 222 and the second NAND gate 223 through the first inverter 221 and is latched by the cross-connected first NAND gate 222 and second NAND gate 223. When a second clock pulse of the clock signal XCK is at a rising edge, i.e., the next clock pulse of the clock signal XCK is at a rising edge, the NAND gate latch circuit 22 is triggered, the driving pulse Gn of the latter stage latched by the cross-connected first NAND gate 222 and second NAND gate 223 is transmitted to the second inverters 224 and then is transmitted out as a driving pulse Gn+1 of a third stage. The clock control transmission circuit 21 further includes a clock signal CK, the clock signal CK and the clock signal XCK being phase inverted.

Figure 4:
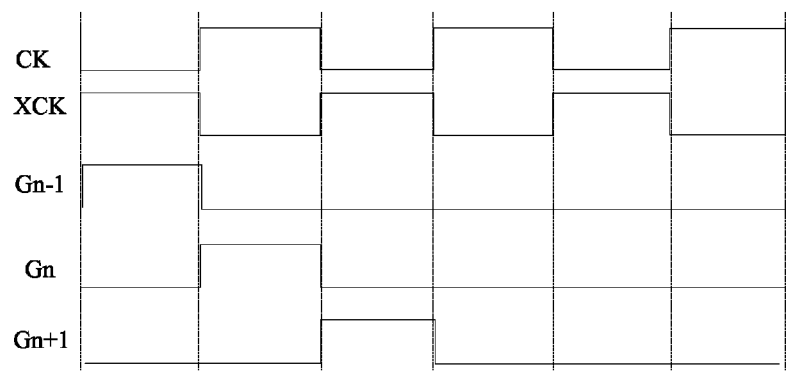
FIG. 4 is a theoretical timing diagram of a NAND gate latched driving circuit of an embodiment of the invention.
Figure 5:
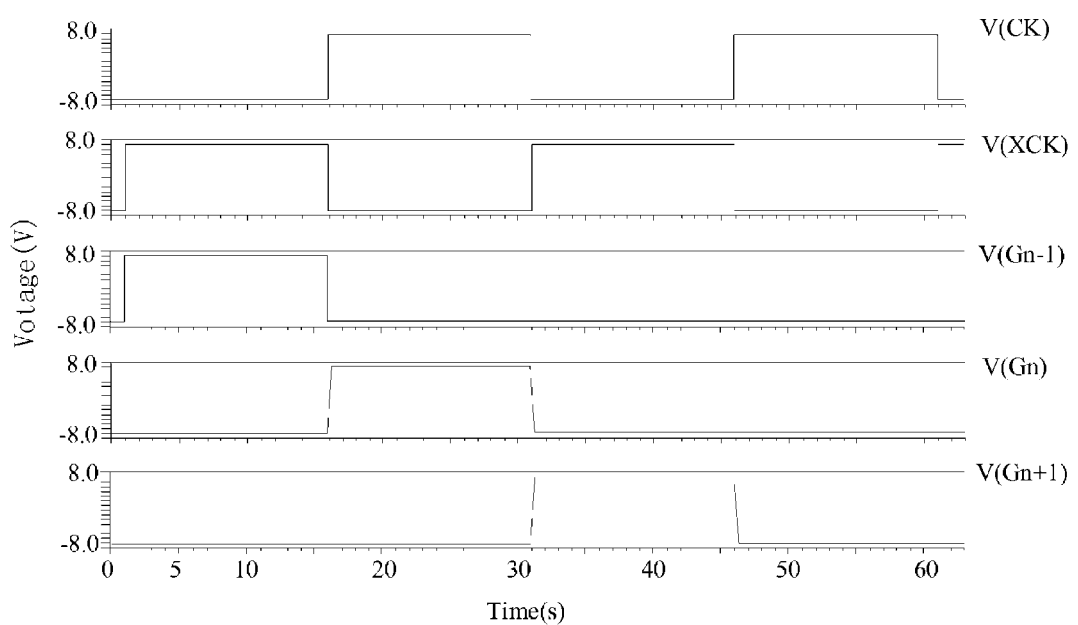
FIG. 5 is a simulation timing diagram of the NAND gate latched driving circuit of the embodiment of the invention.

In this embodiment of the invention, the shift register circuit 10 and the shift register circuit 20 are neighboring with each other. In actual application, the plurality of cascaded connected NAND gate latched shift register circuits in the NAND gate latched driving circuit 1 may be divided into odd stages and even stages, the shift register circuit 10 may be used as an odd stage shift register, and the shift register circuit 20 may be used as an even stage shift register. It also may be that the shift register circuit 20 is used as an odd stage shift register and the shift register circuit 10 is used as an even stage shift register instead. Referring to FIG. 4, which is a theoretical timing diagram of a NAND gate latched driving circuit of an embodiment of the invention. Herein, the shift register circuit 10 is used as an odd stage shift register, and the shift register circuit 20 is used as an even stage shift register. As seen from the figure, the clock signal CK and the clock signal XCK are phase inverted. When the clock signal CK is at a rising edge, the driving pulse Gn−1 of the former stage is transmitted to the gate of the latter stage, i.e., the driving pulse Gn−1 of the former stage is changed from a high voltage level to a low voltage level and the driving pulse Gn of the latter stage is changed from a low voltage level to a high voltage level, so as to drive a corresponding gate. When the clock signal XCK is at a rising edge, the driving pulse Gn of the latter stage is transmitted to the gate of the third stage, i.e., the driving pulse Gn of the latter stage is changed from a high voltage level to a low voltage level and the driving pulse Gn+1 of the third stage is changed from a low voltage level to a high voltage level, so as to driving a corresponding gate. FIG. 5 is a simulation timing diagram of the driving circuit of the embodiment of the invention. Referring to FIG. 5, the vertical coordinate is voltage and the horizontal coordinate is time. As seen from the figure, the simulation timing of the NAND gate latched driving circuit is the same as the theoretical timing in FIG. 4.

The invention also provides a NAND gate latched shift register. Concretely, referring to FIG. 2, the NAND gate latched shift register circuit 10 includes a clock control transmission circuit 11 and a NAND gate latch circuit 12. The NAND gate latch circuit 12 at least includes a first inverter 121, a first NAND gate 122, a second NAND gate 123 and a third NAND gate 124. An input terminal of the first inverter 121 is electrically connected to an output terminal of the clock control transmission circuit 11, a first input terminal of the first NAND gate 122 is electrically connected to an output terminal of the first inverter 123, a second input terminal of the first NAND gate 122 is electrically connected to an output terminal of the second NAND gate 123, a first input terminal of the second NAND gate 123 is electrically connected to the input terminal of the first inverter 122, a second input terminal of the second NAND gate 123 is electrically connected to an output terminal of the first NAND gate 122, the output terminal of the second NAND gate 123 further is electrically connected to a first input terminal of the third NAND gate 124, a second input terminal of the third NAND gate 124 is electrically connected to receive a clock signal CK. The NAND gate latch circuit 12 further includes a multistage inverter circuit electrically connected to an output terminal of the third NAND gate 124 to enhance driving capability. The multistage inverter circuit includes serially connected a plurality of second inverters 125. Preferably, the number of the second inverters 125 is three.

A concrete operation principle of the shift register circuit 10 is as follows: when a first clock pulse of the clock signal CK is at a rising edge, the clock control transmission circuit 11 is triggered to transmit the driving pulse Gn−1 of a former stage to the first inverter 121. In the transmission process, the driving pulse Gn−1 is phase-inverted. After that, the driving pulse Gn−1 of the former stage is transmitted to the first NAND gate 122 and the second NAND gate 123 through the first inverter 121 and is latched by the cross-connected first NAND gate 122 and second NAND gate 123. When a second clock pulse of the clock signal CK is at a rising edge, i.e., the next clock pulse of the clock signal CK is at a rising edge, the NAND gate latch circuit 12 is triggered to transmit the driving pulse Gn−1 of the former stage latched in the cross-connected first NAND gate 122 and second NAND gate 123 to the second inverters 125 and then transmitted to the gate Gn of a latter stage through the second inverters 125. The clock control transmission circuit 11 further includes a clock signal XCK, the clock signal XCK and the clock signal CK being phase inverted. In this embodiment of the invention, it may use a plurality of shift register 10 to cascade connect with one another to form a NAND gate latched driving circuit, uses the clock control transmission circuit 11 to control transmission of a signal between former and latter stages and uses the NAND gate latch circuit 12 to latch the signal, and therefore is suitable for CMOS process and can achieve low power consumption and wide noise tolerance.

It is noted that, the driving pulses disclosed by the invention preferably are gate driving pulses.

In summary, the NAND gate latched driving circuit of the invention uses a clock control transmission circuit triggered by a first clock pulse of a clock signal to transmit a driving pulse of a former stage to a NAND gate latch circuit, and the driving pulse then is latched by the NAND gate latch circuit; the NAND gate latch circuit further is triggered by a subsequent second clock pulse of the clock signal to output a driving pulse. Accordingly, it is suitable for CMOS process and can achieve low power consumption and wide noise tolerance.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A NAND gate latched driving circuit comprising a plurality of cascade connected NAND gate latched shift register circuits, each of the shift register circuits comprising a clock control transmission circuit and a NAND gate latch circuit;
    wherein the clock control transmission circuit is configured for being triggered by a first clock pulse of a clock signal to transmit a driving pulse of a former stage to the NAND gate latch circuit, and the driving pulse then is latched by the NAND gate latch circuit, the NAND gate latch circuit further is configured for being triggered by a subsequent second clock pulse of a first clock signal to output the driving pulse; the clock control transmission circuit and the NAND gate latch circuit individually are rising edge triggered;
    the NAND gate latch circuit at least comprises a first inverter, a first NAND gate, a second NAND gate and a third NAND gate; an input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate, and a second input terminal of the third NAND gate is electrically connected to receive the clock signal.

2. The driving circuit as claimed in claim 1, wherein the clock control transmission circuit phase-inverts the driving pulse in the transmission process of the driving pulse.

3. The driving circuit as claimed in claim 1, wherein the NAND gate latch circuit further comprises a multistage inverter circuit electrically connected to an output terminal of the third NAND gate.

4. The driving circuit as claimed in claim 3, wherein the multistage inverter circuit comprises serially connected a plurality of second inverters.

5. The driving circuit as claimed in claim 4, wherein the number of the plurality of second inverters is three.

6. The driving circuit as claimed in claim 1, wherein the clock signals of neighboring ones of the shift register circuits are phase inverted to each other.

7. A NAND gate latched driving circuit comprising a plurality of cascade connected NAND gate latched shift register circuits, each of the shift register circuits comprising a clock control transmission circuit and a NAND gate latch circuit;
    wherein the clock control transmission circuit is configured for being triggered by a first clock pulse of a clock signal to transmit a driving pulse of a former stage to the NAND gate latch circuit, and the driving pulse then is latched by the NAND gate latch circuit, the NAND gate latch circuit further is configured for being triggered by a subsequent second clock pulse of a first clock signal to output the driving pulse;
    wherein the NAND gate latch circuit at least comprises a first inverter, a first NAND gate, a second NAND gate and a third NAND gate; an input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate, and a second input terminal of the third NAND gate is electrically connected to receive the clock signal.

8. The driving circuit as claimed in claim 7, wherein the clock control transmission circuit is configured for phase-inverting the driving pulse in the transmission process of the driving pulse.

9. The driving circuit as claimed in claim 7, wherein the NAND gate latch circuit further comprises a multistage inverter circuit electrically connected to an output terminal of the third NAND gate.

10. The driving circuit as claimed in claim 9, wherein the multistage inverter circuit comprises serially connected a plurality of second inverters.

11. The driving circuit as claimed in claim 10, wherein the number of the plurality of second inverters is three.

12. The driving circuit as claimed in claim 7, wherein the clock signals of neighboring ones of the shift register circuits are phase inverted to each other.

13. A NAND gate latched shift register comprising a clock control transmission circuit and a NAND gate latch circuit; the NAND gate latch circuit at least comprising a first inverter, a first NAND gate, a second NAND gate and a third NAND gate;

wherein an input terminal of the first inverter is electrically connected to an output terminal of the clock control transmission circuit, a first input terminal of the first NAND gate is electrically connected to an output terminal of the first inverter, a second input terminal of the first NAND gate is electrically connected to an output terminal of the second NAND gate, a first input terminal of the second NAND gate is electrically connected to the input terminal of the first inverter, a second input terminal of the second NAND gate is electrically connected to an output terminal of the first NAND gate, the output terminal of the second NAND gate further is electrically connected to a first input terminal of the third NAND gate.

14. The shift register as claimed in claim 13, wherein the NAND gate latch circuit further comprises a multistage inverter circuit electrically connected to an output terminal of the third NAND gate.

\* \* \* \* \*